United States Patent
Niimi et al.

(10) Patent No.: US 7,799,668 B2
(45) Date of Patent: Sep. 21, 2010

(54) FORMATION OF UNIFORM SILICATE GATE DIELECTRICS

(75) Inventors: Hiroaki Niimi, Dallas, TX (US); Luigi Colombo, Dallas, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 269 days.

(21) Appl. No.: 11/205,477

(22) Filed: Aug. 17, 2005

(65) Prior Publication Data

US 2007/0042555 A1 Feb. 22, 2007

(51) Int. Cl.
*H01L 21/3205* (2006.01)

(52) U.S. Cl. .................. 438/591; 438/261; 438/287; 438/783; 438/784; 438/785; 438/786

(58) Field of Classification Search .......... 438/261, 438/287, 591, 783–786
See application file for complete search history.

(56) References Cited

U.S. PATENT DOCUMENTS

| | | | |
|---|---|---|---|
| 6,383,879 B1 * | 5/2002 | Kizilyalli et al. | 438/303 |
| 2004/0084736 A1 * | 5/2004 | Harada | 257/410 |
| 2005/0045923 A1 | 3/2005 | Chambers | |
| 2005/0151184 A1 * | 7/2005 | Lee et al. | 257/314 |
| 2005/0153571 A1 * | 7/2005 | Senzaki | 438/778 |
| 2006/0094192 A1 * | 5/2006 | Yang et al. | 438/287 |
| 2006/0237803 A1 * | 10/2006 | Zhu et al. | 257/410 |

OTHER PUBLICATIONS

D.A. Buchanan; "Scaling The Gate Dielectric" Materials, Integration, and Reliability; IBM J. Res. Develop., vol. 43, No. 3, May 1999, pp. 245-264.

* cited by examiner

*Primary Examiner*—Kevin M Picardat
*Assistant Examiner*—Bac H Au
(74) *Attorney, Agent, or Firm*—Warren L. Franz; Wade J. Brady, III; Frederick J. Telecky, Jr.

(57) ABSTRACT

The present invention provides method of forming a gate dielectric that includes forming a metal source layer (210) comprising a metal and at least one nonmetallic element over a substrate (110). The metal source layer (210) is formed having a composition rich in the metal. A dielectric layer (310) comprising the metal is formed over the metal source layer (210).

17 Claims, 5 Drawing Sheets

FORMATION OF UNIFORM SILICATE GATE DIELECTRICS

TECHNICAL FIELD OF THE INVENTION

The present invention is directed, in general, to a method of forming a gate dielectric, and in particular, a method of forming a high-k gate dielectric with an improved uniformity of distribution of a metallic element therein.

BACKGROUND OF THE INVENTION

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards are held out for the ones who are ahead in the marketplace in reaching the complexity goal together with offering the most flexible products for application.

The scaling of the components in the lateral dimension requires vertical scaling as well, so as to achieve adequate device performance. This vertical scaling requires the thickness of the gate dielectric, commonly silicon dioxide ($SiO_2$) to be reduced. Thinning of the gate dielectric results in increasing domination of the electrical characteristics by interface effects, and increased leakage of the dielectric due to nontrivial quantum tunneling effects. Therefore, the industry has moved to gate dielectric materials with a larger dielectric constant, or "k," allowing the use of a thicker dielectric while maintaining the same degree of capacitive coupling to the transistor channel.

One material suitable for high-k gate dielectrics is hafnium silicate, ideally represented by its empirical formula $HfSiO_4$. $HfSiO_4$ offers a high degree of compatibility with current semiconductor manufacturing processing, and may be formed using a chemical vapor deposition (CVD) process in conventional manufacturing tools. However, a typical metal-containing film produced by a CVD process has nonuniformities of the constituent elements that result from inherencies in the CVD process as well as interfacial effects. Thus, for example, a hafnium silicate film may have a greater concentration of hafnium, herein referred to as [Hf], at the top surface than at the interface with the substrate. Moreover, the decrease of [Hf] with depth may not be monotonic.

A gradient in the concentration of elemental constituents in a gate dielectric may have an undesirable impact on the performance and reliability of a device using the gate dielectric. For example, a transistor using a material layer with such nonuniformities as a gate dielectric may experience reduced breakdown voltage and operating lifetime, as well as threshold voltage shifts as a result of charge trapping and leakage in the gate dielectric.

In certain semiconductor devices, a manufacturing process synonymously referred to as a "split-gate" or "dual-voltage" process is used to produce transistors with different gate thicknesses, and therefore different gate threshold voltages. Such a process is useful, for example, in devices that require a low-voltage transistor in a high performance "core," and a higher voltage transistor for I/O transistors used to interface the core to external circuitry. In such a device, a core transistor may have a gate thickness of about 1 nm, while I/O transistors may have gate thickness of about 3 nm. In these devices, the performance and reliability issues related to nonuniformities in the gate dielectric are generally not significant in the I/O transistors because the properties of the gate dielectric are dominated by bulk properties. However, these issues cannot be neglected for the core transistors, as the properties of the thinner gate are significantly impacted by the surface effects. Thus, it can be expected that as semiconductor device geometries continue to shrink, the aforementioned performance and reliability issues will become increasingly significant as the industry moves to metal-containing gate dielectric materials for high-performance transistors.

An urgent need exists, therefore, for a method of improving the uniformity of elemental constituents used in comparatively thin gate dielectrics.

SUMMARY OF THE INVENTION

To address the above-discussed deficiencies of the prior art, the present invention provides a method of forming a gate dielectric. The method includes forming a metal source layer comprising a metal and at least one nonmetallic element over a substrate, where the metal source layer has a composition rich in the metal. A dielectric layer containing the metal is formed over the metal source layer to form a gate dielectric layer.

In another aspect, the present invention provides a semiconductor device having a gate dielectric located over a substrate. The gate dielectric includes a metal, and the concentration of the metal across the gate dielectric layer is substantially uniform in the bulk of the gate dielectric layer. Additionally, a gate electrode is located over the gate dielectric layer.

In yet another aspect, the present invention provides a method for manufacturing an integrated circuit. The method includes providing a substrate having a metal-rich layer on it. The metal-rich layer contains a metal and at least one nonmetallic element, and has a composition rich in the metal. The method further includes depositing a dielectric layer that comprises the metal over the metal-rich layer, where the metal-rich layer and dielectric layer in combination form a gate dielectric layer. A gate electrode layer is formed over the gate dielectric layer, and the layers are patterned to form a plurality of gate structures. Interlevel dielectric layers are formed over the gate structures, and interconnects are formed within the interlevel dielectric layers to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIG- UREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Turning to FIGS. 1-8, illustrated are cross-sectional views illustrating how one skilled in the art might manufacture a semiconductor device in accordance with the principles of the present invention. While FIGS. 1-8 are specifically directed to the manufacture of a semiconductor device, FIGS. 1-8 also illustrate, in a broad sense, how one skilled in the art might manufacture a gate dielectric with improved uniformity of a metallic constituent, in accordance with the principles of the present invention. Thus, a method for manufacturing a gate dielectric is discussed within the confines of discussing how one skilled in the art might manufacture a semiconductor device with respect to FIGS. 1-8. Nevertheless, while each of these ideas is discussed and illustrated using a single set of FIGUREs, neither should be limiting on the other.

Figure 1:
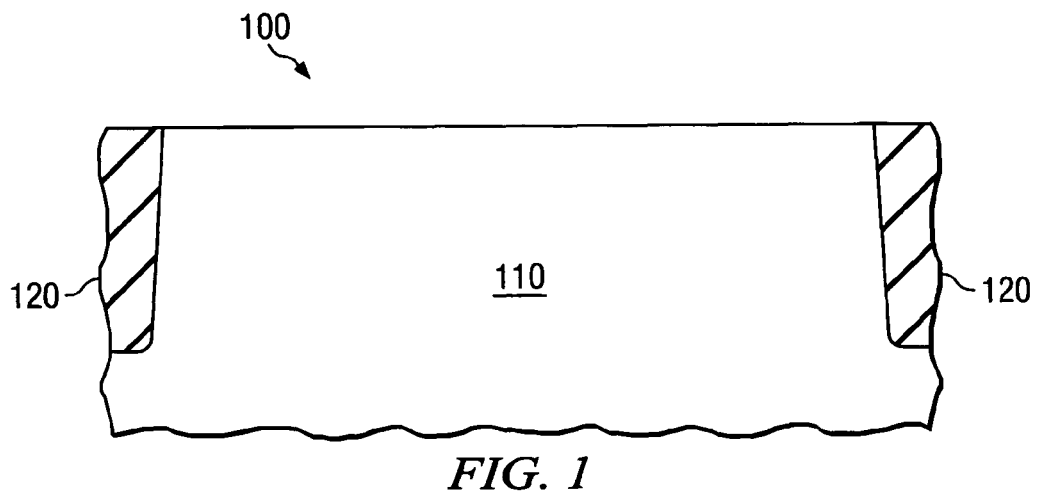
FIG. 1 illustrates a cross-section of a partially fabricated semiconductor device prior to formation of a gate dielectric layer according to the principles of the invention.

Referring initially to FIG. 1, illustrated is a cross-section of a partially fabricated semiconductor device 100 prior to formation of a gate dielectric layer. The partially fabricated semiconductor device 100 comprises a substrate 110. The substrate 110 may be a conventional semiconductor, and may further be a semiconductor wafer suitable for semiconductor device manufacturing. An example of such a wafer is a 200 mm or 300 mm silicon wafer. Those skilled in the art will appreciate that such substrates are available with many possible variations, including the semiconducting material (e.g., Si and GaAs), doping level, silicon-on-insulator, and substrates upon which an epitaxial layer has been formed. Moreover, the substrate 110 may have been processed to provide a number of structural features and layers as part of an incomplete device manufacturing flow. In FIG. 1, for example, isolation structures 120 have been formed as part of a semiconductor device manufacturing flow. Moreover, the substrate 110 may have been previously processed by implantation of dopants to define NMOS and PMOS regions of the substrate 110. These and other similar variations in substrate type are all within the scope of the present invention.

Figure 2A:
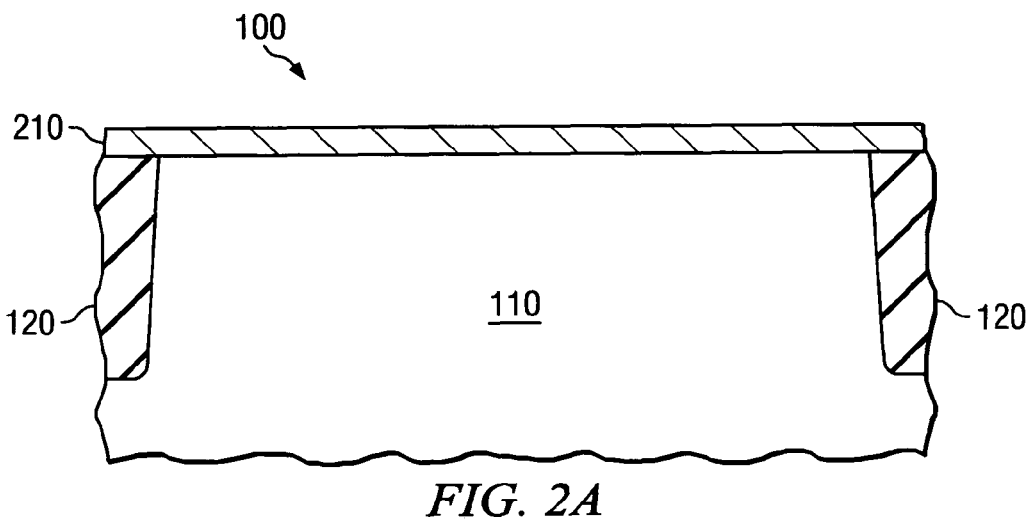
FIGS. 2A and 2B illustrate the cross-section of FIG. 1 after formation of a metal source layer according to the principles of the invention.

Turning to FIG. 2A, the partially fabricated semiconductor device 100 is shown after formation of a metal source layer 210 according to the principles of the invention. The metal source layer 210 comprises a metallic element and at least one nonmetallic element. In the inventive method, the metal source layer 210 is formed in a manner that results in a composition that is rich in the metallic element, compared to an ideal stoichiometry of a compound of the metallic and nonmetallic elements. For the purpose of the invention, "rich in the metallic element" is defined as having a concentration of the metallic element higher than the concentration corresponding to the empirical formula of the nominal compound formed by the elemental constituents of the layer. For example, in one embodiment, the metal source layer 210 may comprise hafnium and oxygen. A balanced compound of hafnium and oxygen is $HfO_2$. The ratio of hafnium to oxygen in $HfO_2$ is 1:2, for an atomic concentration of hafnium of 33%. Thus, a concentration of hafnium greater than 33% is regarded as rich in hafnium.

The metal source layer 210 may be formed by a chemical vapor deposition (CVD), physical vapor deposition (PVD), or atomic layer deposition (ALD) process, in which the process conditions are controlled to produce a layer rich in the metallic element. In an exemplary embodiment, the metal source layer 210 is a hafnium-rich hafnium dioxide layer formed by a CVD process. The CVD process uses hafnium tetra-diethylamide (TDEAH) and oxygen as the feedstock, with a TDEAH flow rate of 70-80 mg/min and an oxygen flow rate of 200-300 sccm for 20-40 seconds. In addition, the pressure is maintained at 150-250 Pa, and the temperature is controlled to between 550° C.-650° C. The film resulting from this process will generally have a thickness ranging from approximately 0.4 nm to 0.8 nm, and a concentration of hafnium ranging from about 40 at. % to about 50 at. %.

The invention may also be practiced using other metallic elements suitable for the formation of high-k gate dielectrics. In particular, while not limiting the scope of the invention, alternate embodiments of the invention include using zirconium, hafnium, yttrium, tantalum, lanthanides and actinides as the metallic element in the metal source layer 210. In these alternate embodiments, the range of concentration of the metal may differ from the range recited for the embodiment using hafnium.

Figure 2B:
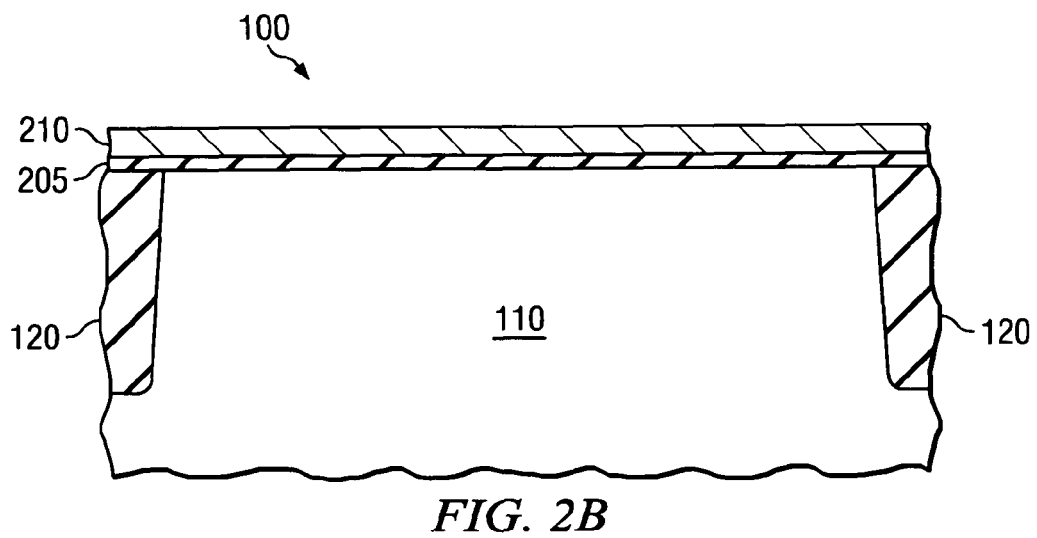

Turning now briefly to FIG. 2B, illustrated is an alternative embodiment of the present invention wherein an interfacial layer 205 is formed over the substrate 110 prior to forming the metal source layer 210. In one exemplary embodiment of the present invention, the interfacial layer is silicon dioxide. Nevertheless, other interfacial layers could be used without departing from the scope of the present invention.

Figure 3:
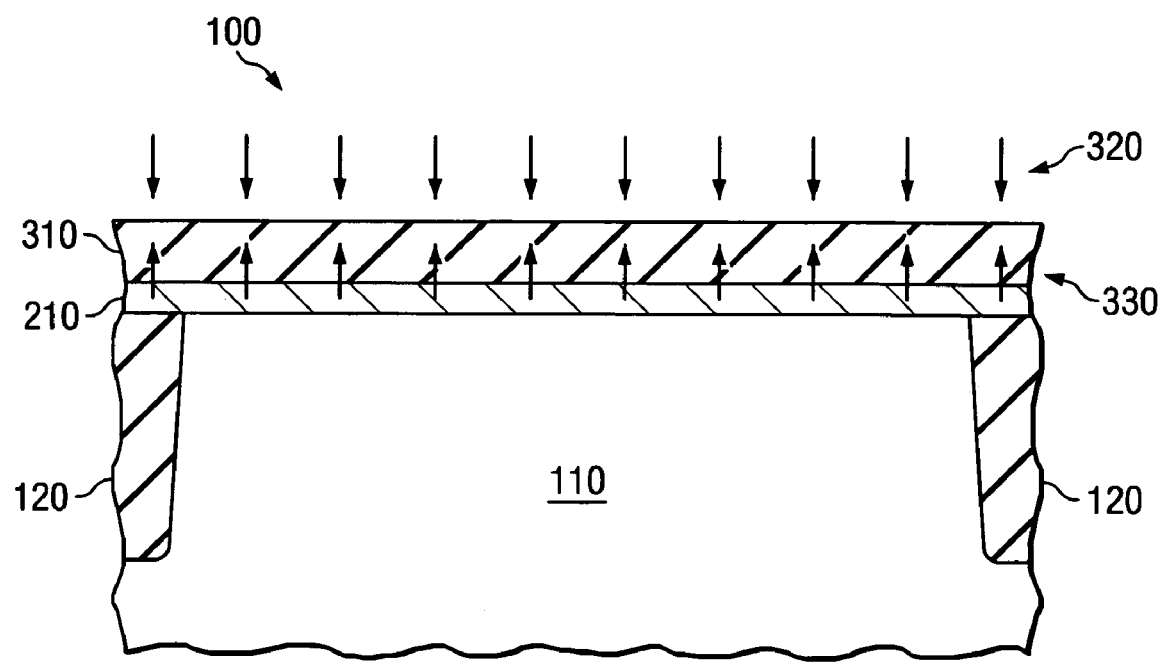
FIG. 3 illustrates the cross-section of FIG. 2A during formation of a dielectric layer over the metal source layer.

Turning to FIG. 3, illustrated is a cross-sectional view of the partially fabricated semiconductor device 100 illustrated in FIG. 2A during formation of a dielectric layer 310 over the metal source layer 210. The dielectric layer 310 also comprises the metal comprised in the metal source layer 210, and may additionally comprise a non-metallic element present in the metal source layer 210. For example, if the metal source layer 210 comprises hafnium and oxygen, then the dielectric layer 310 will also comprise hafnium, and may comprise oxygen. More specifically, without limitation of the invention, the metal source layer 210 may be hafnium-rich hafnium dioxide, and the dielectric layer 310 may be hafnium silicate.

The dielectric layer 310 may be conventionally deposited by CVD. Moreover, as previously described, it is an aspect of the invention that the dielectric layer 310 comprises the metallic element present in the metal source layer 210. Thus, alternate embodiments of the dielectric layer 310 include using the same metallic element recited for alternate embodiments of the metal source layer 210, namely, zirconium, hafnium, yttrium, tantalum, lanthanides and actinides.

While not limiting the scope of the present invention by theory, it is believed that the metal atoms in the metal source layer 210 are incorporated into the dielectric layer 310 as the dielectric layer 310 is formed to produce a material layer with improved uniformity of the metal relative to deposition of the dielectric layer onto a substrate free of the metal.

This process is illustrated in FIG. 3, in which reactive flux lines 320 represent the reactive flux due to the deposition process used to form the dielectric layer 310. Metal flux lines 330 represent the flux of metal atoms from the metal source layer 210 into the growing dielectric layer 310. In the embodiment in which the dielectric layer 310 is hafnium silicate, then the reactive flux lines 320 represent the flux of hafnium, silicon and oxygen to the substrate 110, and the metal flux lines 330 represent the flux of hafnium from the metal source layer 210 into the growing dielectric layer 310.

Figure 4:
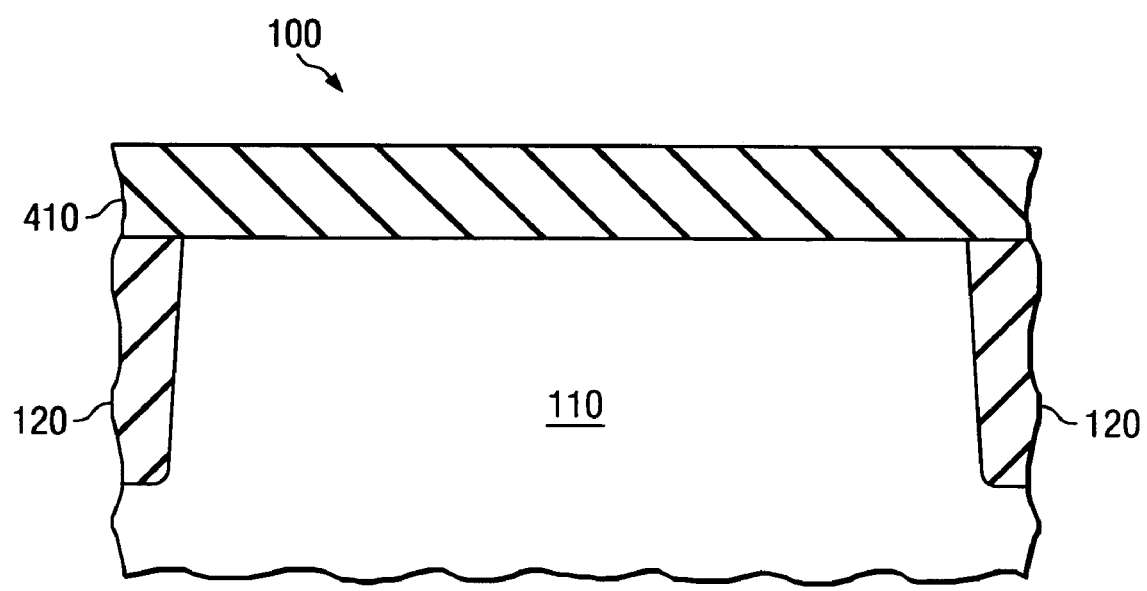
FIG. 4 illustrates the cross-section of FIG. 3 after formation of the dielectric layer, in which the dielectric layer and the metal source layer have combined to form a gate dielectric layer.

Turning to FIG. 4, the partially fabricated semiconductor device 100 is illustrated after the deposition of the dielectric layer 310 onto the metal source layer 210. The deposition has resulted in the formation of a gate dielectric layer 410 with improved uniformity of the metal in the gate dielectric layer 410 due to deposition onto the metal source layer 210. The resulting gate dielectric layer 410 generally has a thickness ranging from about 2 nm to about 5 nm. Nevertheless, other thicknesses are within the purview of the present invention. Similarly, a concentration of hafnium in a bulk of the gate dielectric layer 410 advantageously ranges from about 20 atomic percent to about 80 atomic percent.

Figure 5:
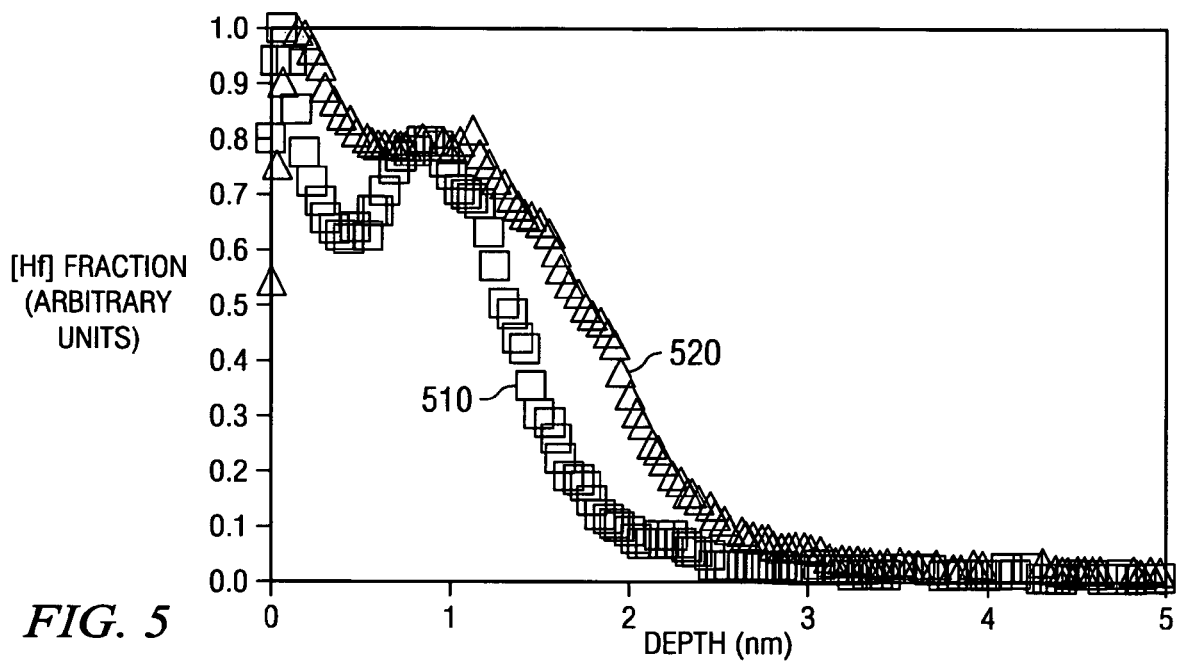
FIG. 5 presents depth profiles of the concentration of hafnium in a hafnium silicate film deposited in a conventional manner (squares), and in a hafnium silicate film deposited onto a hafnium-rich hafnium dioxide layer according to the principles of the invention (triangles)

This improved uniformity of the metal in the gate dielectric layer 410 is illustrated in FIG. 5, which presents depth profiles of the concentration of hafnium in a hafnium silicate film deposited in a conventional manner, and in a hafnium silicate film deposited onto a hafnium-rich hafnium dioxide layer. A first concentration profile 510, portrayed as squares, shows the measured concentration of hafnium, [Hf], with increasing depth in an exemplary hafnium silicate film deposited by CVD for 30 seconds directly onto a hafnium-free substrate. Thus, the first concentration profile 510 represents the conventional method of forming a gate dielectric. The hafnium concentration was determined by time-of-flight secondary ion mass spectrometry (ToF-SIMS). The data have been normalized to set the maximum [Hf] to an arbitrary value of unity, so [Hf] is expressed in arbitrary units (a.u.). The first concentration profile 510 initially shows an increasing hafnium concentration in the first few data points. Those skilled in the art appreciate that such an initial increase is an artifact of surface contamination of the sample, and may be disregarded in the present discussion. The concentration of hafnium is initially about one a.u., decreases to a local minimum of about 0.6 a.u. at a depth of about 0.5 nm, increases with depth to a local maximum of about 0.8 a.u. at a depth of about 1 nm, and decreases monotonically to a hafnium concentration of about zero at a depth of about 3 nm.

In FIG. 5, a second concentration profile 520, portrayed as triangles, shows the measured concentration of hafnium with increasing depth in an exemplary hafnium silicate film deposited by CVD for 30 seconds onto a substrate having an layer of hafnium-rich hafnium dioxide formed as described previously. The second concentration profile 520 is representative of the hafnium concentration profile obtained by the inventive method of forming a gate dielectric. Again, the first few data points may be disregarded. In contrast to the first concentration profile 510, the concentration of hafnium in the hafnium silicate film deposited onto a hafnium-rich hafnium dioxide layer decreases in a substantially monotonic manner from the surface to the substrate. At a depth greater than about 1.2 nm, the hafnium concentration additionally has a lower concentration gradient as it decreases to about zero at about 3 nm of depth.

Between a depth of about 0.5 nm and about 1.2 nm, hafnium has a substantially uniform concentration of about 0.8 a.u. in the second concentration profile 520. This range represents a "bulk" portion of the gate dielectric layer 410, in which the concentration of the constituent elements is substantially free of interfacial effects. One of ordinary skill in the pertinent art understands that the thickness of the bulk of a film will depend on the total thickness of the film. In the example of the second concentration profile 520, the bulk is about 0.7 nm thick. In the bulk of the film, the first concentration profile 510 varies about ±0.1 a.u. around an average of about 0.7 a.u., corresponding to a variation of about 30%. In contrast, the second concentration profile 520 shows a much smaller variation of less than about 5%.

The more uniform concentration of hafnium displayed by the second concentration profile 520 provides significant advantages over that of the first concentration profile 510. Because nonuniformity of concentration of constituents of a gate dielectric may result in charge trapping and gate leakage, a transistor using a gate dielectric formed according to the invention can be expected to have greater operating lifetime and lower gate leakage. Moreover, formation of the gate dielectric layer 410 is compatible with standard semiconductor manufacturing tools, minimizing expense and risk to the manufacturing sequence.

Figure 6:
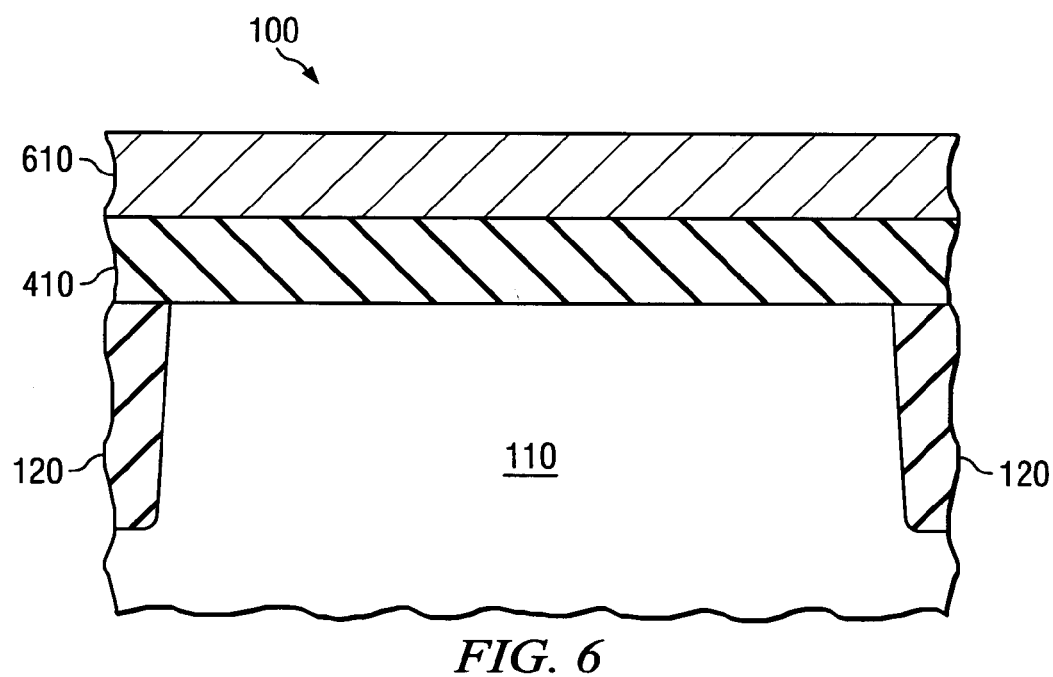
FIGS. 6 through 8 illustrate cross-sections of additional steps in an exemplary method of manufacturing a semiconductor device according to the principles of the present invention.

Turning now to FIG. 6, illustrated is a cross-sectional view of the partially fabricated semiconductor device 100 after conventional formation of a gate electrode layer 610 onto the gate dielectric layer 410. The gate electrode layer 610 may be a semiconductor material such as polycrystalline silicon (Si) or silicon germanium (Si—Ge), or may be a metal gate deposited by suitable means. In one embodiment, the gate electrode layer 610 comprises the same metal as the gate dielectric layer 410. Thus, for example, if hafnium silicate is used as the gate dielectric layer 410, then the gate electrode layer 610 may also comprise hafnium. However, the scope of the present invention is not limited to this embodiment.

Figure 7:
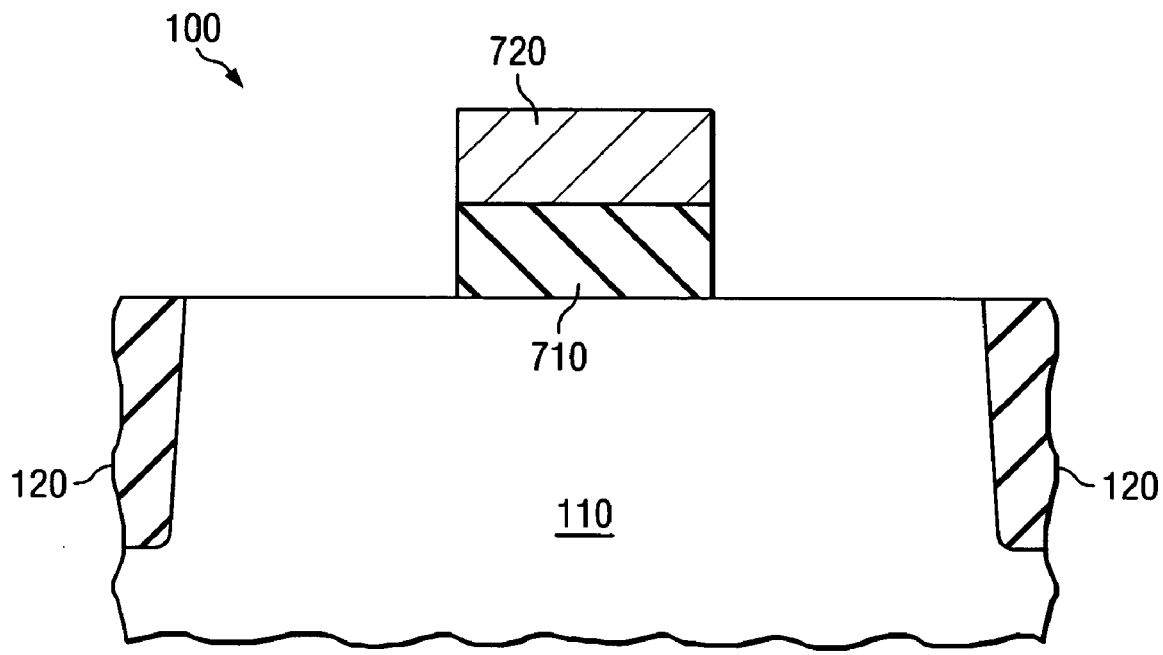

Turning to FIG. 7, illustrated is a cross-section of the partially completed semiconductor device 100 after the gate electrode layer 610 and the gate dielectric layer 410 have been patterned by conventional means to form a gate dielectric 710 and a gate electrode 720. Such patterning typically includes a photolithography process and a plasma etch process. Those of ordinary skill in the art will appreciate that the plasma etch process will be tailored to the particular materials used for the gate electrode layer 610 and the gate dielectric layer 410.

Figure 8:
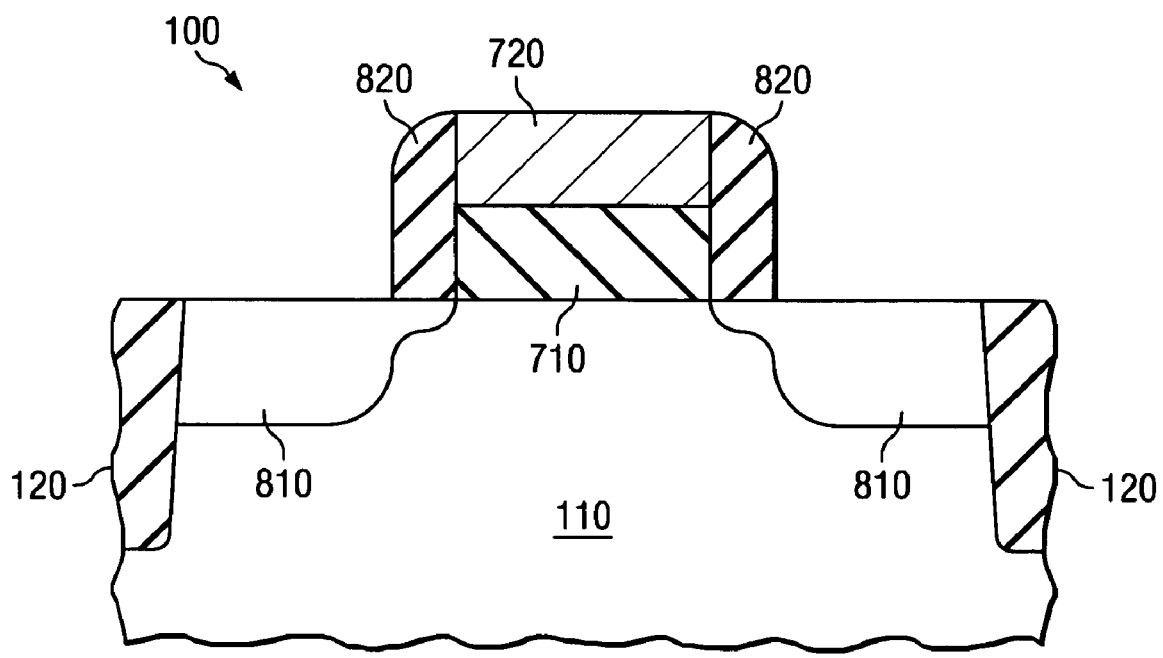

Briefly turning to FIG. 8, illustrated is a cross-section of the partially completed semiconductor device 100 after formation of source/drain regions 810 and sidewall spacers 820. These elements of the semiconductor device 100 are formed by conventional means well known to those skilled in the pertinent arts.

Figure 9:
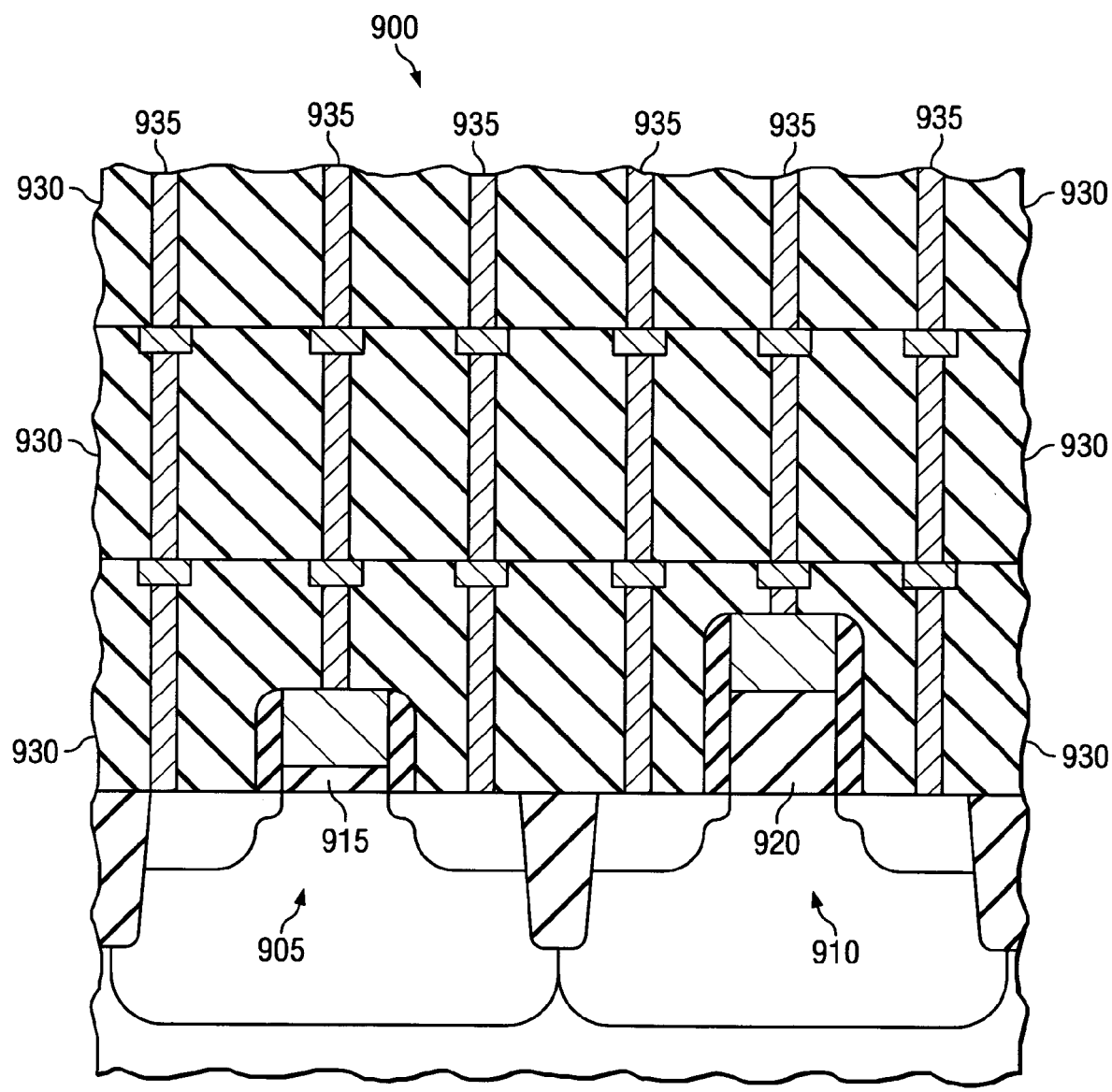
FIG. 9 illustrates a cross-section of an integrated circuit fabricated using gate dielectrics formed according to the principles of the present invention.

Finally, turning to FIG. 9, illustrated is an exemplary cross-sectional view of an integrated circuit (IC) 900 comprising transistors 905, 910, incorporating gate dielectrics 915, 920, respectively, formed according to the principles of the present invention. The IC 900 may include MOS, BiCMOS or bipolar components, and may further include passive components, such as capacitors, inductors or resistors. It may also include optical components or optoelectronic components. Those skilled in the art are familiar with these various types of components and their manufacture. The IC 900 may also be a dual-voltage IC, comprising transistors operating with difference threshold voltages. The particular embodiment illustrated in FIG. 9 is a dual-voltage IC, as reflected in the different thicknesses of the gate dielectrics 915, 920.

Dielectric layers 930 are fabricated over the transistors 905, 910 using conventional means. Additionally, interconnect structures 935 are located within the dielectric layers 930 to interconnect various components, thus forming the operational integrated circuit 900. It will be apparent to one skilled in the art that several variations of the exemplary interconnect architecture may be fabricated according to the principles of the invention with similarly advantageous results.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   providing a silicon substrate; and
   forming a uniform homogeneous hafnium silicate gate dielectric layer on the silicon substrate using a two-step chemical vapor deposition process, including:
      depositing a hafnium-rich initial portion of hafnium and oxygen on the silicon substrate; and
      depositing a bulk portion of hafnium silicate over the hafnium-rich initial portion;
      whereby hafnium atoms in the initial portion are incorporated into the bulk portion as the bulk portion is formed, to produce the gate dielectric layer as a single dielectric layer with a uniform hafnium concentration depth profile.

2. The method of claim 1, further comprising forming a hafnium gate electrode layer over the gate dielectric layer.

3. The method of claim 1, wherein the hafnium-rich initial portion is deposited using hafnium tetra-diethylamide and oxygen.

4. The method of claim 3, wherein the hafnium-rich initial portion is deposited with a hafnium tetra-diethylamide flow rate of 70-80 mg/min. and an oxygen flow rate of 200-300 sccm for 20-30 seconds, a pressure of 150-250 Pa, and a temperature of 550° C.-650° C.

5. The method of claim 1, wherein the concentration of hafnium in the hafnium-rich initial portion is greater than 40 at. %.

6. The method of claim 1, wherein the hafnium-rich initial portion is deposited to a thickness of less than 0.8 nm.

7. The method of claim 6, wherein the hafnium-rich initial portion is deposited using hafnium tetra-diethylamide and oxygen.

8. The method of claim 7, wherein the hafnium-rich initial portion is deposited with a hafnium tetra-diethylamide flow rate of 70-80 mg/min. and an oxygen flow rate of 200-300 sccm for 20-30 seconds, a pressure of 150-250 Pa, and a temperature of 550° C.-650° C.

9. The method of claim 8, further comprising forming a hafnium gate electrode layer over the gate dielectric layer.

10. A method for manufacturing a semiconductor device, comprising:
    providing a silicon substrate; and
    forming a uniform homogeneous high-k gate dielectric layer of a silicate of metal comprising at least one of zirconium, hafnium, yttrium, tantalum, lanthanide or actinide metal on the silicon substrate, using a two-step chemical vapor deposition process, including:
       depositing an initial portion, rich in the metal, of the metal and oxygen on the silicon substrate; and
       depositing a bulk portion of a silicate of the metal over the metal-rich initial portion of the metal and oxygen;
       whereby atoms of the metal in the metal-rich initial portion are incorporated into the bulk portion as the bulk portion is formed, to produce the gate dielectric layer as a single dielectric layer with a uniform metal concentration depth profile.

11. The method of claim 10, further comprising forming a gate electrode layer comprising the metal over the gate dielectric layer.

12. The method of claim 10, wherein the metal-rich initial portion is deposited to a thickness of less than 0.8 nm.

13. The method of claim 12, further comprising forming a gate electrode layer comprising the metal over the gate dielectric layer.

14. A method of forming a uniform metal silicate gate dielectric layer on a silicon substrate, comprising a two-step process including:
    in a first step, depositing an initial portion of hafnium and oxygen on the silicon substrate using chemical vapor deposition; the initial portion having a thickness less than 0.8 nm and a hafnium concentration of greater than 33 at. %; and
    in a second step, depositing a bulk portion of hafnium silicate over the initial portion using chemical vapor deposition;
    whereby hafnium atoms in the initial portion are incorporated into the bulk portion as the bulk portion is formed to produce the gate dielectric layer as a single dielectric layer with a uniform hafnium concentration depth profile.

15. The method of claim 14, wherein the hafnium-rich initial portion is deposited using hafnium tetra-diethylamide and oxygen.

16. The method of claim 15, wherein the hafnium-rich initial portion is deposited with a hafnium tetra-diethylamide flow rate of 70-80 mg/min. and an oxygen flow rate of 200-300 sccm for 20-30 seconds, a pressure of 150-250 Pa, and a temperature of 550° C.-650° C.

17. The method of claim 16, wherein the concentration of hafnium in the hafnium-rich initial portion is greater than 40 at. wt. %.

\* \* \* \* \*